United States Patent
Park et al.

(10) Patent No.: US 8,450,159 B2
(45) Date of Patent: May 28, 2013

(54) THIN FILM TRANSISTOR, FABRICATION METHOD OF SAME, AND DISPLAY DEVICE HAVING THE SAME

(75) Inventors: Jong-Hyun Park, Yongin (KR); Chun-Gi You, Yongin (KR); Sun Park, Yongin (KR); Jin-Hee Kang, Yongin (KR); Yul-Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 68 days.

(21) Appl. No.: 12/929,733

(22) Filed: Feb. 11, 2011

(65) Prior Publication Data
US 2011/0248279 A1 Oct. 13, 2011

(30) Foreign Application Priority Data
Apr. 12, 2010 (KR) .................. 10-2010-0033524

(51) Int. Cl.
*H01L 21/336* (2006.01)
(52) U.S. Cl.
USPC ........... 438/158; 438/164; 438/166; 438/487; 257/72; 257/66; 257/E21.411
(58) Field of Classification Search
USPC ....... 257/72, 66, E29.273, E21.411; 438/158, 438/164, 166, 487
See application file for complete search history.

(56) References Cited

U.S. PATENT DOCUMENTS

| | | | |
|---|---|---|---|
| 6,274,888 B1* | 8/2001 | Suzuki et al. | 257/72 |
| 6,424,012 B1* | 7/2002 | Kawasaki et al. | 257/350 |
| 6,608,326 B1* | 8/2003 | Shinagawa et al. | 257/64 |
| 6,737,673 B2* | 5/2004 | Yamazaki | 257/63 |
| 6,759,628 B1* | 7/2004 | Ino et al. | 219/121.8 |
| 2003/0094611 A1* | 5/2003 | Hayakawa | 257/49 |
| 2006/0267491 A1* | 11/2006 | Koo et al. | 313/511 |

FOREIGN PATENT DOCUMENTS

| | | |
|---|---|---|
| KR | 10-1998-0012633 | 4/1998 |
| KR | 10 1998-0012633 A | 4/1998 |
| KR | 10-2008-0043417 A | 5/2008 |
| KR | 10 2008-0043417 A | 5/2008 |
| KR | 10-2008-0073560 A | 8/2008 |
| KR | 10 2008-0073560 A | 8/2008 |
| KR | 10 2008-0084449 A | 9/2008 |
| KR | 10-2008-0084449 A | 9/2008 |
| KR | 10 2008-0085503 A | 9/2008 |
| KR | 10 2009-0078631 A | 7/2009 |
| KR | 10 2010-0005900 A | 1/2010 |

* cited by examiner

*Primary Examiner* — Thinh T Nguyen
(74) *Attorney, Agent, or Firm* — Lee & Morse, P.C.

(57) ABSTRACT

A thin film transistor, a method of manufacturing the same, and a display device including the same, the thin film transistor including a substrate; a polysilicon semiconductor layer on the substrate; and a metal pattern between the semiconductor layer and the substrate, the metal pattern being insulated from the semiconductor layer, wherein the polysilicon of the semiconductor layer includes a grain boundary parallel to a crystallization growing direction, and a surface roughness of the polysilicon semiconductor layer defined by a distance between a lowest peak and a highest peak in a surface thereof is less than about 15 nm.

11 Claims, 13 Drawing Sheets

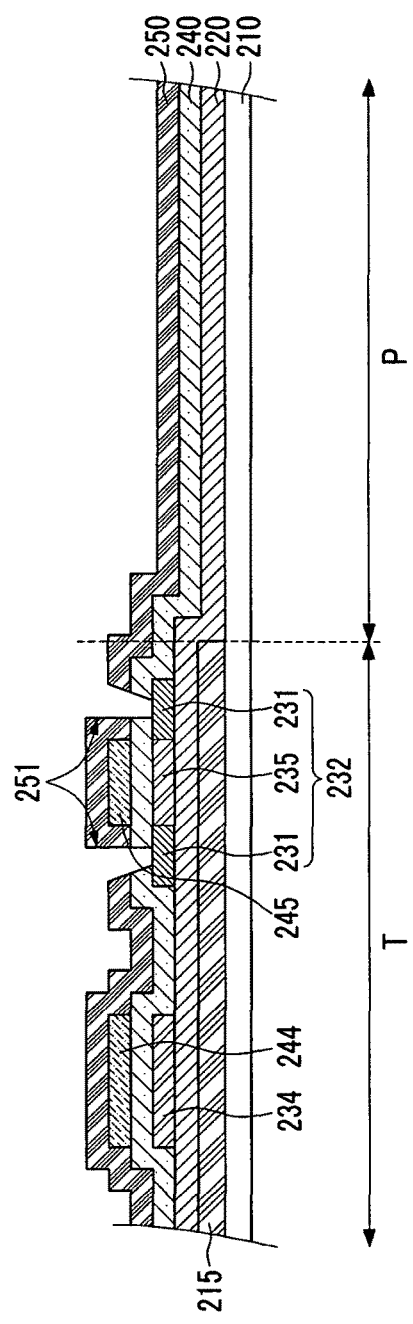

THIN FILM TRANSISTOR, FABRICATION METHOD OF SAME, AND DISPLAY DEVICE HAVING THE SAME

BACKGROUND

1. Field

Embodiments relate to a thin film transistor, a manufacturing method of the same, and a display device including the same.

2. Description of the Related Art

A flat panel display (FPD) may be used as a display device, rather than a cathode ray tube display device, due to desirable characteristics including, e.g., compact size and light weight, and may include, e.g., a liquid crystal display (LCD) and an organic light emitting diode (OLED) display. Among them, the organic light emitting diode (OLED) display is a display device that utilizes a phenomenon where excitons are formed by a recombination of electrons and holes that are inserted through a cathode and an anode in a organic thin film so that light having a specific wavelength is emitted by energy from the excitons. The OLED may have excellent luminescence and viewing angle characteristics compared with the liquid crystal display (LCD) and does not require a backlight, thereby having increasing its desirability in that it may be ultra-thin.

The OLED display device may use a thin film transistor as a switch element. Thus, stable luminance may be realized with a uniform current supplied to each pixel of a display area. Here, the semiconductor layer of the thin film transistor may be made of, e.g., amorphous silicon (a-Si) or polysilicon (polycrystalline silicon; poly-Si). The polysilicon may have relative high electron mobility compared with the amorphous silicon such that a thin film transistor including the semiconductor layer made of polysilicon is mainly applied.

The above information disclosed in this Background section is only for enhancement of understanding of the background of the described technology and therefore it may contain information that does not form the prior art that is already known in this country to a person of ordinary skill in the art.

SUMMARY

Embodiments are directed to a thin film transistor, a manufacturing method of the same, and a display device including the same, which represent advances over the related art.

It is a feature of an embodiment to provide a thin film transistor in which a metal pattern, e.g., a gate electrode or a light blocking member, is under a semiconductor layer and the semiconductor layer is made of polysilicon without an uncompleted crystallization growing region, thereby improving driving characteristics and reliability of the thin film transistor.

At least one of the above and other features and advantages may be realized by providing a thin film transistor including a substrate; a polysilicon semiconductor layer on the substrate; and a metal pattern between the semiconductor layer and the substrate, the metal pattern being insulated from the semiconductor layer, wherein the polysilicon of the semiconductor layer includes a grain boundary parallel to a crystallization growing direction, and a surface roughness of the polysilicon semiconductor layer defined by a distance between a lowest peak and a highest peak in a surface thereof is less than about 15 nm.

The grain boundary may be parallel to a current flow direction.

The metal pattern may be a gate electrode corresponding to a portion of the semiconductor layer.

The thin film transistor may further include a gate insulating layer between the metal pattern and the semiconductor layer; an interlayer insulating layer on the semiconductor layer; and a source/drain electrode on the interlayer insulating layer, the source/drain electrode being electrically connected to one side of the semiconductor layer.

The metal pattern may be a light blocking member including one or a plurality of opaque layers.

The metal pattern may further include one or a plurality of transparent layers at one side of or between the one or the plurality of opaque layers.

At least one of the above and other features and advantages may also be realized by providing a method for manufacturing a thin film transistor including a semiconductor layer made of polysilicon, the method including forming a metal pattern on a substrate; forming a first insulating layer on the metal pattern; forming an amorphous silicon layer on the first insulating layer; crystallizing the amorphous silicon layer into a polysilicon layer by using a directional lateral solidification process; and patterning the polysilicon layer to form the semiconductor layer.

The directional lateral solidification process may include repeatedly performing a crystallization process including firstly irradiating with a pulse type to a predetermined region of the amorphous silicon layer with a line-shaped laser beam having a length of about 365 nm to about 1100 nm, a width of about 5 to about 20 μm, and an energy density of about 150 to about 1000 mJ/cm$^2$, moving the laser beam by less than half of the width of the laser beam in a first direction, and secondarily irradiating with a pulse type to another predetermined region of the amorphous silicon layer with the line-shaped laser.

The polysilicon layer may include a grain boundary parallel to the first direction, and the polysilicon layer may be crystallized to have a surface roughness defined by a distance between a lowest peak and a highest peak in a surface thereof of less than about 15 nm.

The grain boundary may be parallel to a current flow direction.

The metal pattern may be a gate electrode corresponding to a portion of the semiconductor layer, and the first insulating layer may be a gate insulating layer.

The method may further include forming an interlayer insulating layer on the semiconductor layer; and forming a source/drain electrode on the interlayer insulating layer such that the source/drain electrode is electrically connected to one side of the semiconductor layer.

The metal pattern may be a light blocking member including one or a plurality of opaque layers.

The opaque layer may include carbon or at least one of Fe, Co, V, Ti, Al, Ag, Si, Ge, Y, Zn, Zr, W, Ta, Cu, and Pt.

The method may further include forming a gate insulating layer on the semiconductor layer; forming a gate electrode on the gate insulating layer such that the gate electrode overlaps a portion of the semiconductor layer; forming an interlayer insulating layer on the gate electrode; and forming a source/drain electrode on the interlayer insulating layer such that the source/drain electrode is electrically connected to one side of the semiconductor layer.

The metal pattern may further include one or a plurality of transparent layers positioned at a side of or between the one or the plurality of opaque layers.

The transparent layer may include at least one of $SiO_x$ (x=1), $SiN_x$ (x=1), $MgF_2$, $CaF_2$, $Al_2O_3$, and $SnO_2$, or at least one of ITO, IZO, ZnO, and $In_2O_3$.

At least one of the above and other features and advantages may also be realized by providing a display device including one or a plurality of thin film transistors, wherein each thin film transistor includes a metal pattern and a polysilicon semiconductor layer on the metal pattern, and the polysilicon semiconductor layer includes a grain boundary parallel to a crystallization growing direction, and a surface roughness of the polysilicon semiconductor layer defined by a distance between a lowest peak and a highest peak in a surface thereof is less than about 15 nm.

The display device may further include a substrate; a metal pattern on the substrate; a gate insulating layer on the metal pattern; a semiconductor layer on the gate insulating layer, the semiconductor layer including a channel region corresponding to the metal pattern and a source/drain region neighboring the channel region; an interlayer insulating layer on the semiconductor layer; a source/drain electrode on the interlayer insulating layer, the source/drain electrode being electrically connected to the source/drain region; a planarization layer on the source/drain electrode; a lower electrode on the planarization layer, the lower electrode being electrically connected one of the source/drain electrode; an organic layer on the lower electrode, the organic layer including one or a plurality of emission layers; and an upper electrode on the organic layer.

The display device may further include a substrate, the substrate including a first region and a second region; a metal pattern on the first region of the substrate; a buffer layer on the metal pattern; a semiconductor layer on the first region of the buffer layer, the semiconductor layer including a channel region and a source/drain region doped with an impurity; a gate insulating layer on the semiconductor layer; a gate electrode corresponding to the channel region on the gate insulating layer; an interlayer insulating layer on the gate electrode; a source/drain electrode on the insulating layer, the source/drain electrode being electrically connected to the source/drain region; a protective layer on the source/drain electrode; a lower electrode on the second region of the protective layer, the lower electrode being electrically connected one of the source/drain electrode; an organic layer on the lower electrode, the organic layer including one or a plurality of emission layers; and an upper electrode on the organic layer.

BRIEF DESCRIPTION OF THE DRAWINGS

The above and other features and advantages will become more apparent to those of ordinary skill in the art by describing in detail exemplary embodiments with reference to the attached drawings, in which:

FIG. 5A to 5G illustrate cross-sectional views of stages in a manufacturing method of a display device including a thin film transistor according to another embodiment.

DETAILED DESCRIPTION

Figure 1:
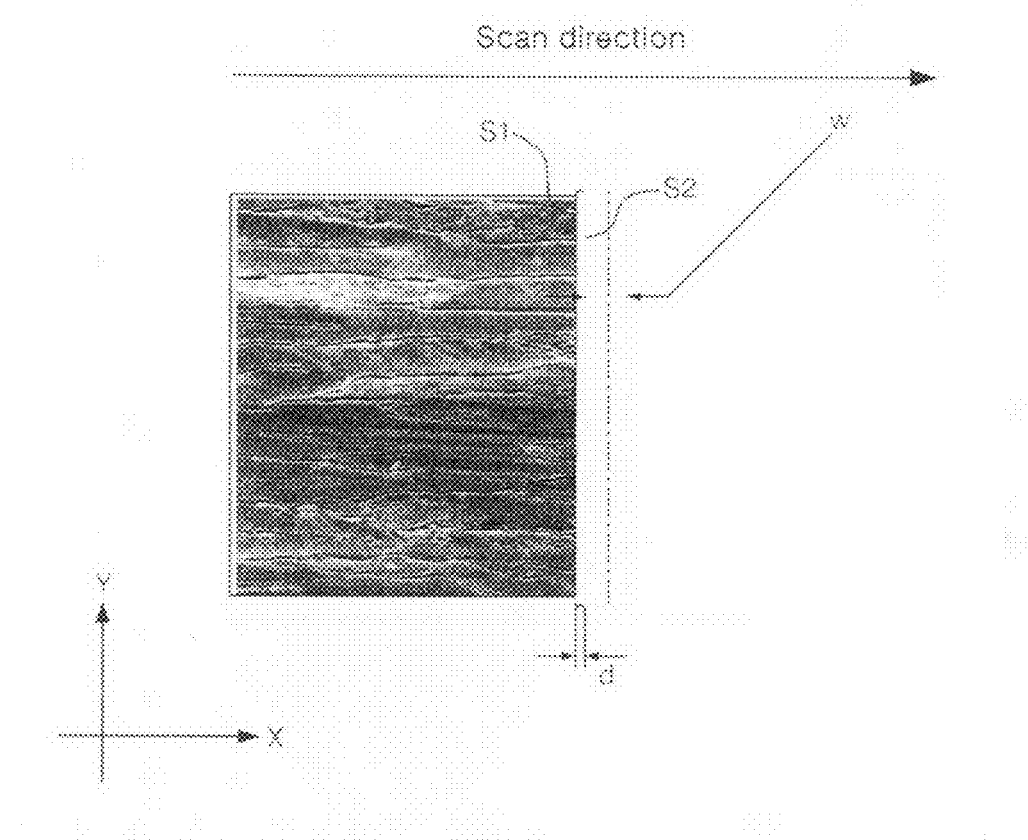
FIG. 1 illustrates a schematic diagram of a directional lateral solidification process using directional lateral solidification according to an embodiment.

Korean Patent Application No. 10-2010-0033524, filed on Apr. 12, 2010, in the Korean Intellectual Property Office, and entitled: "Thin Film Transistor, Fabrication Method of the Same, and Display Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Objects, technical constitutions, and effects of the present invention will be described more fully hereinafter with reference to the accompanying drawings, in which exemplary embodiments of the invention are shown. i) The structural shapes, sizes, ratios, numbers, etc., are schematically illustrated in the accompanying drawings such that they may be altered. ii) The drawings are shown from the viewpoint of observation such that the direction or location for explaining the drawings may be variously changed depending upon the position of the observer. iii) Even when reference is made to different elements, like reference numerals may be used to designate those elements. iv) When the terms "include," "have," or the like are used, the relevant subject may include other parts unless the term "only" is used to define the contents thereof. v) When explanation is made by way of a singular term, it may be interpreted in a plural manner as well as in a singular manner. vi) Even when the numerical values, shapes, size comparisons, positional relations, etc. are not explained with the adverb "about" or "substantially," they may be so interpreted as to include common error ranges. vii) Even when the terms "after," "before," "and," "here," "subsequently," or the like are introduced, they are not meant to define temporal locations. viii) The terms "the first," "the second," etc. are used only for convenience in distinction selectively, commutatively, or repeatedly, and are not meant to be read in any defined manners. ix) It will be understood that when an element is referred to as being "on," "over," "above," "below," or "beside" another element, it can be directly on the other element or one or more intervening elements may also be present. x) When the connective "or" is used to connect two elements, it indicates the respective elements and a combination thereof, but when the quantifier "any one of" is attached to the connective, it indicate only the respective element. xi) The term "comparative example" is simply used for comparison, it does not mean a conventional art, and it may be a technique that is not disclosed as the scope of the present invention.

In a display device including a thin film transistor of a bottom-gate type in which a gate electrode is under a semiconductor layer or a display device including a thin film transistor having a light blocking member on a substrate and displaying an image in a direction of a substrate as a bottom light emitting type, when crystallizing amorphous silicon on a metal pattern into polysilicon through, e.g., excimer laser annealing (ELA) crystallization or sequential lateral solidification (SLS) crystallization, due to the metal pattern, e.g., the light blocking member or the gate electrode under the semiconductor layer of the thin film transistor, heat flow may be generated at a heat source of a laser beam irradiated to the amorphous silicon in a direction of the metal pattern. Also, crystallization of the amorphous silicon may not sufficiently occur such that the semiconductor layer may include an uncompleted crystallization growing region, and, as a result, driving characteristics and the reliability of the thin film transistor including the semiconductor layer may be deteriorated.

In a thin film transistor and a display device including the same according to an embodiment, amorphous silicon on a metal pattern, e.g., a gate electrode or a light blocking member, may be crystallized into polysilicon by, e.g., thin beam directional lateral solidification (DLS). Thus, a semiconductor layer may be formed on the metal pattern and may include the polysilicon without the uncompleted crystallization growing region.

First, the directional lateral solidification may include a method in which a first region of the amorphous silicon is crystallized by a first laser irradiation. Then, a second region including an interface between the region crystallized by the first laser irradiation and the amorphous silicon may be crystallized through a secondary laser irradiation. Thus, polysilicon having a relatively increased size of grains may be formed.

Here, the directional lateral solidification may not use a mask. Rather, the directional lateral solidification may use a laser beam of a line shape, i.e., a line-shaped laser beam, having a predetermined length and width, i.e., different from sequential lateral solidification (SLS). In addition, the secondary laser irradiation may be carried out after silicon melted by the first laser irradiation is crystallized into polysilicon, i.e., different from excimer laser annealing (ELA) in which a laser beam having a width of about 400 µm scans or is irradiated to the amorphous silicon surface for the crystallization.

FIG. 1 illustrates a schematic diagram of a crystallization process using directional lateral solidification according to an embodiment.

Referring to FIG. 1, describing the directional lateral solidification in detail, the line-shaped laser beam having a predetermined width w may be firstly irradiated to a first region S1 to completely melt the amorphous silicon of the first region S1.

Here, the laser beam used for the directional lateral solidification may have energy of a completion melting region or a completion melting neighboring region that is capable of completely and momentary or quickly melting the amorphous silicon.

The silicon melted by the first laser irradiation may be cooled after finishing the first laser irradiation such that the crystallization may be firstly generated in an interface between the amorphous silicon and the melted silicon, thereby forming a seed.

Here, a temperature gradient of which the temperature is gradually decreased in a direction toward the melted silicon from the interface between the amorphous silicon and the melted silicon by coagulation potential heat generated when forming the seed. Heat flow may be generated in a direction of a central portion of the melted silicon such that the grain of the polysilicon formed by the silicon cooling is laterally grown until the melted silicon is completely coagulated.

Here, in the polysilicon, a grain boundary, i.e., a boundary between neighboring grains that are grown, may be generated. A growing direction of the grain, i.e., the grain boundary that is generated parallel to the irradiation direction X of the laser, may be referred to as a secondary grain boundary.

Also, the grain of the polysilicon may be simultaneously grown at both interfaces of the melted silicon such that the growing of the grain is stopped or ends at a center portion of the melted silicon and a different grain boundary is generated between the facing grains that are grown. This direction may be vertical or perpendicular to the growing direction of the grain, i.e., the grain boundary that is generated in the direction Y that is vertical or perpendicular to the laser irradiation direction (X is the proceeding direction of the laser), is referred to as a primary grain boundary.

Next, the laser may be secondarily irradiated to a second region S2 including the interface between the first region S1 in which the polysilicon has been formed and the amorphous silicon. Thus, the polysilicon and the amorphous silicon may be melted in the second region S2.

After the secondary laser irradiation is finished, the melted silicon of the second region S2 may be grown and crystallized from the seed of the grain of the polysilicon of the first region S1 that is not melted by the secondary laser irradiation such that the polysilicon includes a grain having a relatively increased length.

Here, the directional lateral solidification may be executed for the secondary laser irradiation region S2 to include the primary grain boundary. A moving distance d of a laser irradiation device for the secondary laser irradiation may be determined based on the width w of the laser beam.

Figure 2:
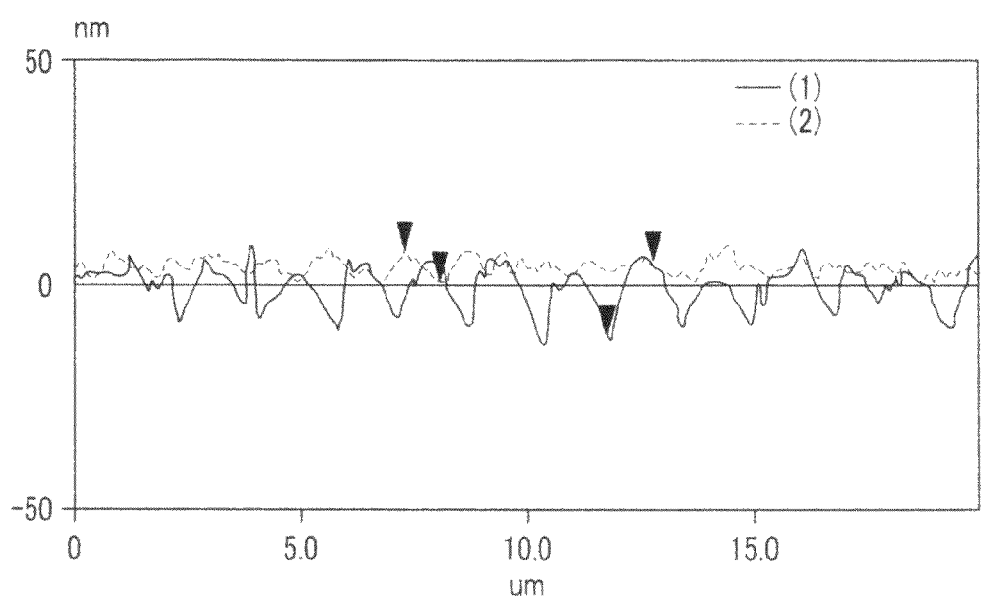
FIG. 2 illustrates a graph of measurements of surface roughness of a polysilicon crystallized by directional lateral solidification.

FIG. 2 illustrates a graph showing a surface line of polysilicon crystallized by directional lateral solidification. In FIG. 2, (1) is a graph of a surface line of the polysilicon in a laser irradiation direction X and (2) is a graph of a surface line of the polysilicon in a direction Y vertical or perpendicular to the laser irradiation direction X.

Here, the surface line as a line continuously showing a height of the surface of the interface that is divided from other objects or materials represents surface roughness through a distance between a highest peak and a lowest peak of the line.

Referring to FIG. 2, in the surface of the polysilicon, it may be seen that the distance between the highest peak and the lowest peak of the line, i.e., the surface roughness of the grain, is less than about 15 nm. Accordingly, the surface roughness of the polysilicon crystallized by the directional lateral solidification may not be large when compared with, e.g., excimer laser annealing (ELA) and sequential lateral solidification (SLS).

Figure 3A:
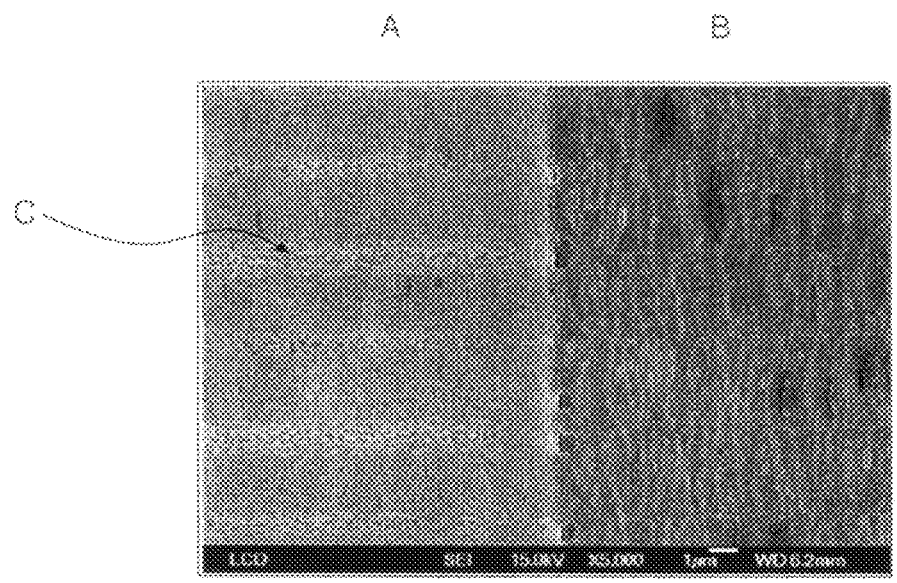
FIG. 3A illustrates an image showing polysilicon crystallization from amorphous silicon by sequential lateral solidification crystallization in a case in which a metal is positioned under a portion of the amorphous silicon.
Figure 3B:
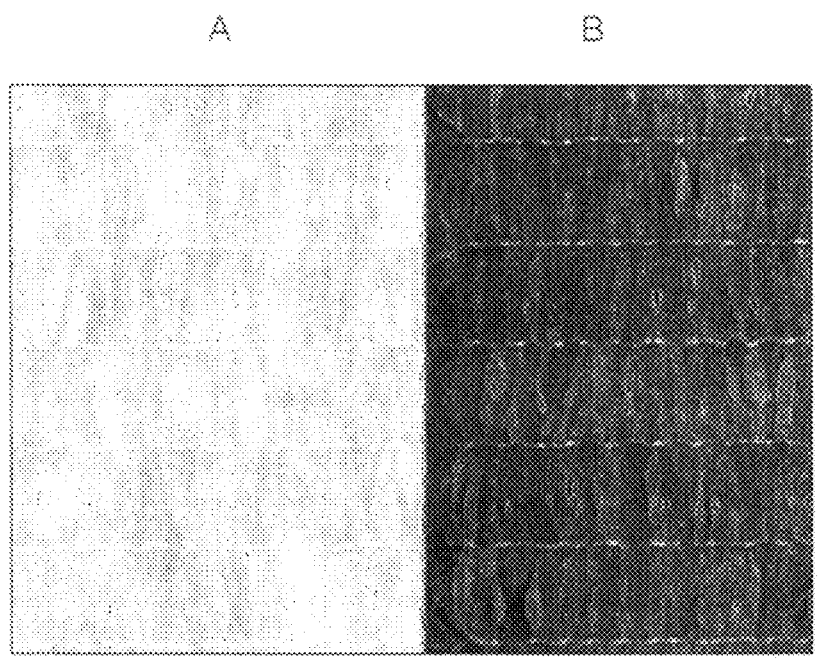
FIG. 3B illustrates an image showing polysilicon crystallization from amorphous silicon by directional lateral solidification in a case in which a metal is positioned under a portion of the amorphous silicon.

FIGS. 3A and 3B illustrate images showing polysilicon formed by crystallizing the amorphous silicon at a region A where metal is positioned and region B where metal is not positioned. In particular, FIG. 3A illustrates the polysilicon crystallized by sequential lateral solidification (SLS) and FIG. 3B illustrates the polysilicon crystallized by directional lateral solidification.

Referring to FIGS. 3A and 3B, the sequential lateral solidification crystallization (SLS) may form polysilicon that does not include an uncompleted crystallization growing region at the region B where the metal is not positioned. However, the SLS may form polysilicon including the uncompleted crystallization growing region C at a region where the secondary grain boundary is formed in the region A where the metal is positioned. The directional lateral solidification may form polysilicon that does not include the uncompleted crystallization growing region at the region A where the metal is positioned and at the region B where the metal is not positioned.

Accordingly, for a thin film transistor and a display device including the same according to an embodiment, when forming the semiconductor layer under which the metal pattern is positioned, the amorphous silicon layer on the metal pattern may be crystallized into the polysilicon layer by using the directional lateral solidification to form the semiconductor layer. Thus, the semiconductor layer may be made of polysilicon wherein the uncompleted crystallization growing region is not formed on the metal pattern.

FIG. 4A to 4F illustrate cross-sectional views of stages in a manufacturing method of a display device including a thin film transistor according to an embodiment.

Figure 4A:
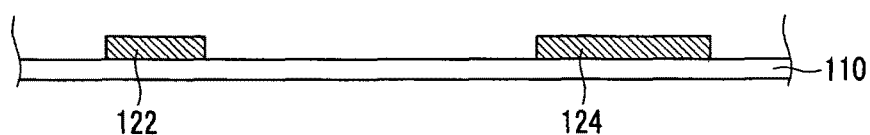
FIG. 4A to 4F illustrate cross-sectional views of stages in a manufacturing method of a display device including a thin film transistor according to an embodiment.

Referring to FIG. 4A to 4F, describing the manufacturing method of the display device including the thin film transistor according to the present embodiment, as illustrated in FIG. 4A, a first conductive material layer (not illustrated) may be formed on a substrate 110 made of a material, e.g., glass, synthetic resins, and stainless steel. The, the first conductive material layer may be etched to form a gate electrode 122 and a capacitor lower electrode 124 that are separated from each other on the substrate 110.

Here, the first conductive material layer may be formed with a single layer including, e.g., tungsten (W), molybdenum (Mo), tungsten silicide ($WSi_2$), molybdenum silicide ($MoSi_2$), chromium (Cr), aluminum (Al), and/or alloys thereof, or a multi-layer in which, e.g., aluminum alloy is deposited on tungsten (W), chromium (Cr), molybdenum (Mo), and/or alloys thereof.

Figure 4B:
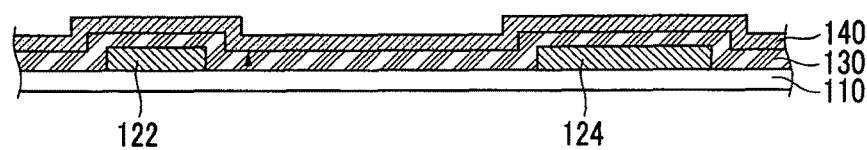

Next, as illustrated in FIG. 4B, a gate insulating layer 130 may be formed on the substrate 110 including the gate electrode 122 and the capacitor lower electrode 124. In addition, an amorphous silicon layer (not illustrated) may be formed on the gate insulating layer 130. Then, the amorphous silicon layer may be crystallized into a polysilicon layer 140 by using, e.g., directional lateral solidification.

Here, when the polysilicon layer is etched through a following process to form the semiconductor layer, a grain boundary parallel to a crystallization growing direction in the polysilicon or the amorphous silicon layer may be crystallized such that the secondary grain boundary is parallel to a direction of the current flowing through the semiconductor layer, i.e., a current flow direction. Accordingly, driving characteristics of the thin film transistor including the semiconductor layer may be further improved.

The directional lateral solidification may not use a mask and may execute the crystallization process by using the laser beam of a line shape having a width of about 5 to about 20 μm and a length of about 365 nm to about 1100 nm. The laser beam may have an energy of a completion melting region or a completion approximate region capable of momentary or quickly and completely melting the amorphous silicon. Preferably, the laser beam has an energy density of about 150 to about 1000 $mJ/cm^2$.

Also, to further easily and completely melt the amorphous silicon, the laser beam used for the directional lateral solidification may be irradiated at about 600 to about 1000 w. The laser beam may be a XeF or KrF laser that is oscillated with a pulse shape and may have a predetermined frequency and may provide a stamping method.

Here, in the directional lateral solidification, the secondary laser irradiation region may include the primary grain boundary, i.e., the moving distance d of the laser irradiation device for the secondary laser irradiation may be less than half of the width of the laser beam such that the polysilicon having a longer grain may be formed. In addition, the moving distance d of the laser irradiation device may be about 1 to about 3 μm when considering a width of about 5 to about 20 μm of the laser beam used for the directional lateral solidification.

Figure 4C:
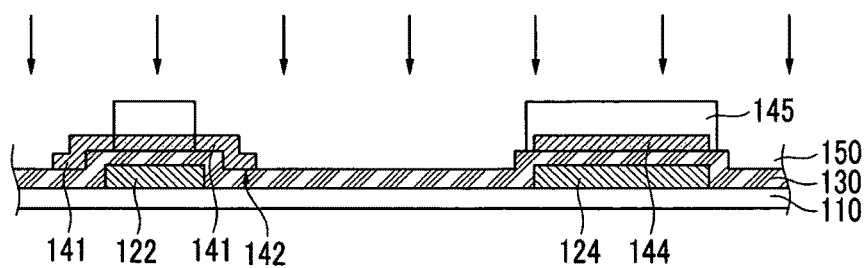

Next, as illustrated in FIG. 4C, the polysilicon layer 140 may be etched to form a semiconductor layer 142 on the gate electrode 122 and a capacitor upper electrode 144 on the capacitor lower electrode 124.

Next, a photoresist layer 145 may be formed on a region corresponding to the gate electrode 122 of the semiconductor layer 142 and a region corresponding to the capacitor upper electrode 144 on the substrate 110. An impurity of a P type or N type may be doped by using the photoresist layer 145 as a mask to form a source/drain region 141 doped with the impurity and a channel region where the impurity is not doped in the semiconductor layer 142.

The P-type impurity may include, e.g., boron (B), aluminum (Al), gallium (Ga), and/or indium (In). The N-type impurity may include, e.g., phosphorus (P), arsenic (As), antimony (Sb), and/or bismuth (Bi).

In the manufacturing method of a display device including the thin film transistor according to the present embodiment, the photoresist layer 145 may be formed on the capacitor upper electrode 144 such that the polysilicon of the capacitor upper electrode 144 is not doped with the impurity, thereby forming a metal oxide silicon (MOS) type of capacitor. However, in an implementation, the photoresist layer 145 may not be formed on the capacitor upper electrode 144 such that the capacitor upper electrode 144 may be simultaneously doped with the impurity along with the source/drain region 141 of the semiconductor layer 142, thereby forming a metal insulator metal (MIM) type of capacitor.

Figure 4D:
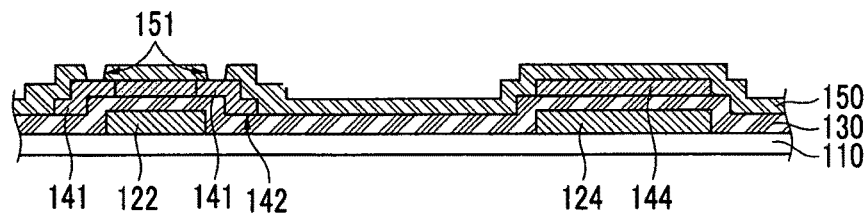

Next, as illustrated in FIG. 4D, an interlayer insulating layer 150 may be formed on the substrate 110 including the semiconductor layer 142 and the capacitor upper electrode 144. The interlayer insulating layer 150 may be etched to form contact holes 151 exposing a portion of the source/drain region 141 of the semiconductor layer 142.

Figure 4E:
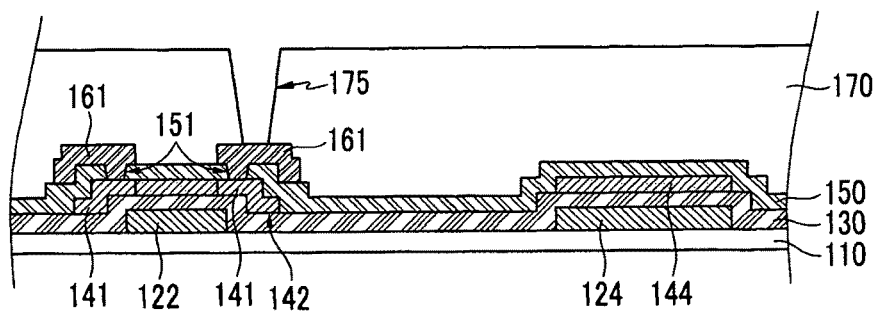

Next, as illustrated in FIG. 4E, a second conductive material layer (not illustrated) may be formed on the interlayer insulating layer 150. Then, the second conductive material layer may be etched to form a source/drain electrode 161 connected to the source/drain region 141 through the contact hole 151, thereby completing the thin film transistor according to the present embodiment. Here, the second conductive material may include, e.g., moly-tungsten (MoW), aluminum (Al), and/or an aluminum alloy such as aluminum-neodymium (Al—Nd).

In an implementation, the display device according to the present embodiment may include a thin film transistor of a coplanar type in which the source region, the channel region, and the drain region are realized in one semiconductor layer, but it is not limited thereto.

Next, a planarization layer 170 may be formed on the source/drain electrode 161. Then, the planarization layer 170 may be etched to form a via hole 175 exposing a portion of one source/drain electrode 161.

Here, the planarization layer 160 may include, e.g., a benzocyclobutene (BCB), a polyimide (PI), a polyamide (PA), an acryl resin, and/or a phenol resin.

The manufacturing method of the display device including the thin film transistor according to the present embodiment may include forming the planarization layer 170 on the source/drain electrode 161. However, in an implementation, a protective layer (not illustrated) of an inorganic insulating layer including, e.g., silicon oxide ($SiO_2$), silicon nitride ($SiN_x$), or a deposition structure, may be formed on the substrate 110 including the source/drain electrode 161 and then the planarization layer 170 may be formed thereon.

Figure 4F:
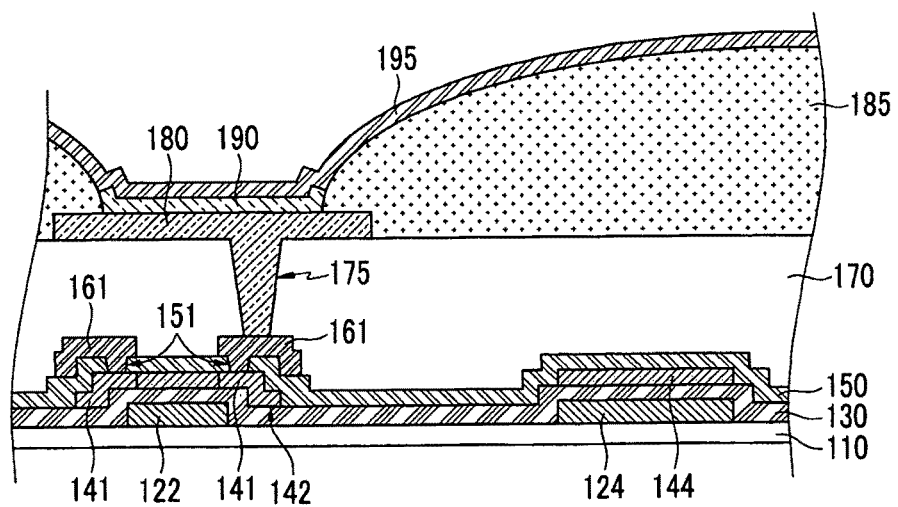

Next, as illustrated in FIG. 4F, a third conductive material layer (not illustrated) may be formed on the planarization layer 170. Then, the third conductive material layer may be etched to form a lower electrode 180 connected to the one source/drain electrode 161 through the via hole 175.

The third conductive material layer may be a transparent conductive layer e.g., ITO and/or IZO, or a reflective layer (not illustrated) including, e.g., aluminum, an aluminum alloy, silver, and/or a silver alloy. In an implementation, the transparent conductive layer may be formed on the reflective layer, thereby forming the lower electrode having a dual structure including the reflective layer and the transparent conductive layer.

Next, a pixel definition layer 185 exposing a portion of the lower electrode 180 may be formed on the planarization layer 170. An organic layer 190 including one or a plurality of emission layers (not illustrated) may be formed on the lower electrode 180 exposed through the pixel definition layer 185. An upper electrode 195 may then be formed on the organic layer 190, thereby completing the display device including the thin film transistor according to the present embodiment.

Here, the pixel definition layer 185 may include, e.g., a polyimide, a benzocyclobutene series resin, a phenol resin, and/or an acrylate.

In the manufacturing method of the display device including the thin film transistor according to the present embodiment, the first conductive material layer may be etched on the substrate 110 to form the capacitor lower electrode 124 and the polysilicon layer 140 may be etched to form the capacitor upper electrode 144. However, in an alternative implementation, the polysilicon layer 140 may be etched to form the capacitor lower electrode 124 and the second conductive material layer may be etched to form the capacitor upper electrode 144.

As a result, in the manufacturing method of the display device including the thin film transistor of the bottom-gate type in which the gate electrode is under the semiconductor layer, the amorphous silicon layer on the gate electrode may be formed into the polysilicon layer by using the directional lateral solidification. Then, the polysilicon layer may be etched to form the semiconductor layer of the thin film transistor. Thus, the semiconductor layer made of the polysilicon that does not include the uncompleted crystallization growing region may be formed.

FIG. 5A to 5G illustrate cross-sectional views of stages in a manufacturing method of a display device including a thin film transistor according to another embodiment.

Figure 5A:
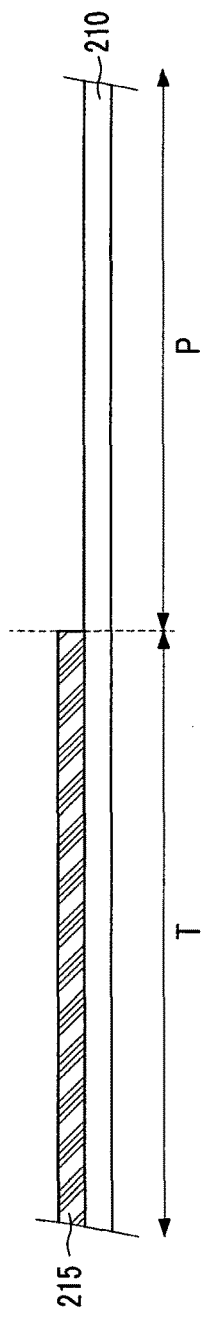

Referring to FIG. 5A to 5G, in describing the manufacturing method of the display device including the thin film transistor according to the present embodiment, as illustrated in FIG. 5A, a light blocking member 215 may be formed on a first region T of a substrate 210. The substrate may be made of a material, e.g., glass, synthetic resins, and/or stainless steel, and may include the first region T and a second region P.

Here, the light blocking member 215 may be positioned on the substrate 210 and may include one or a plurality of opaque layers (not shown). The opaque layers may include, e.g., Fe, Co, V, Ti, Al, Ag, Si, Ge, Y, Zn, Zr, W, Ta, Cu, Pt, and/or alloys thereof, and/or may be made of a layer including carbon (C).

Also, the light blocking member 215 may further include one or a plurality of transparent layers (not illustrated) at one side of the opaque layer or between the plurality of opaque layers. The transparent layer may include an insulating material layer including, e.g., $SiO_x$ (x=1), $SiN_x$ (x=1), $MgF_2$, $CaF_2$, $Al_2O_3$, $SnO_2$, and/or mixtures thereof. In an implementation, the transparent layer may include a conductive material layer including, e.g., indium tin oxide (TO), indium zinc oxide (IZO), ZnO, and/or $In_2O_3$. In another implementation, the transparent layer may be formed in a structure in which both the insulating material layer and the transparent conducting material layer are deposited.

Figure 5B:
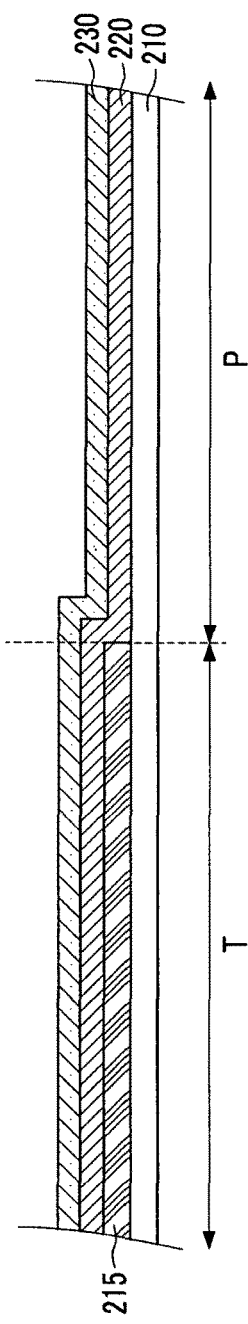

Next, as illustrated in FIG. 5B, a buffer layer 220 may be formed on the substrate 210 including the light blocking member 215. An amorphous silicon layer (not illustrated) may be formed on the buffer layer 220. Then, the amorphous silicon layer may be crystallized into a polysilicon layer 230 by using the directional lateral solidification.

Here, when the polysilicon layer 230 is etched through a following process to form the semiconductor layer 232, a grain boundary parallel to a crystallization growing direction in the polysilicon 230 or the amorphous silicon layer may be crystallized such that the secondary grain boundary is parallel to a direction of the current flowing through the semiconductor layer 232, i.e., a current flow direction. Accordingly, driving characteristics of the thin film transistor including the semiconductor layer may be further improved.

In addition, the directional lateral solidification may have a width of about 5 μm to about 20 μm and the line laser beam of a XeF or KrF laser that is oscillated with a pulse may be sequentially irradiated with energy density of about 150 to about 1000 $mJ/cm^2$ to the amorphous silicon, such that polysilicon having a relatively increased grain size may be formed without the usage of a mask. This detailed method is described above, and a repeated description thereof is omitted here.

Figure 5C:
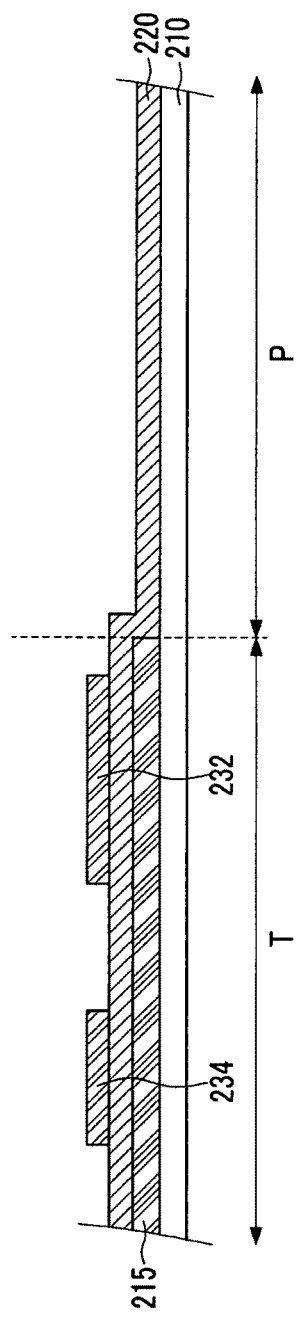

Next, as illustrated in FIG. 5C, the polysilicon layer 230 may be etched to form a semiconductor layer 232 and a capacitor lower electrode 234 that are separated from each other on the light blocking member 215.

Figure 5D:
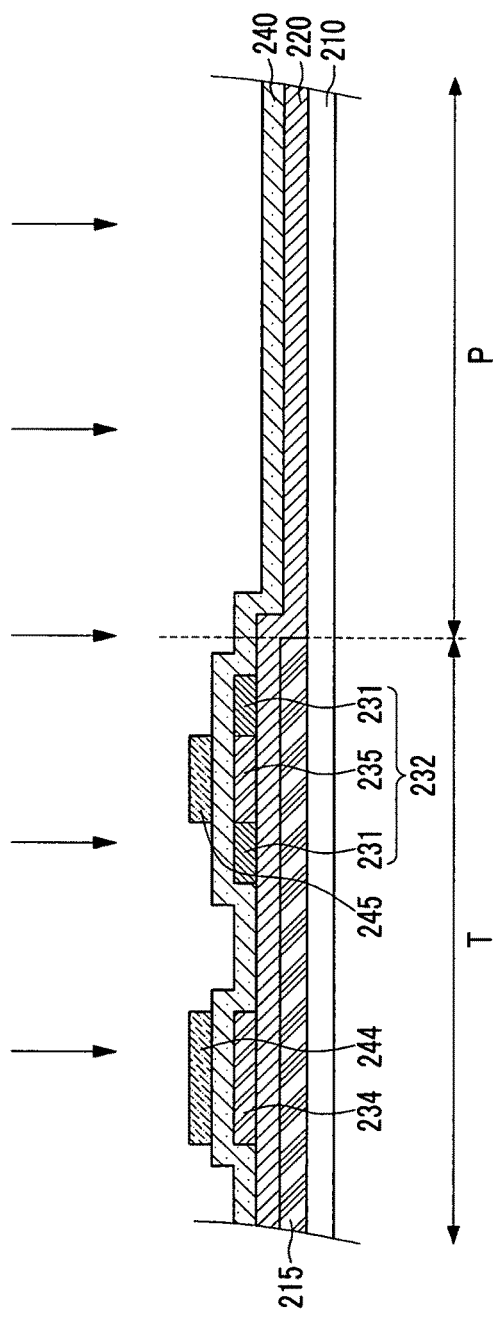

Next, as illustrated in FIG. 5D, a gate insulating layer 240 may be formed on a whole surface of the substrate 210 including the semiconductor layer 232 and the capacitor lower electrode 234. A first conductive material layer (not illustrated) may be formed on the gate insulating layer 240. Then, the first conductive material layer may be etched to form a gate electrode 245 corresponding to a portion of the semiconductor layer 232 and a capacitor upper electrode 244 corresponding to the capacitor lower electrode 234.

Here, the first conductive material layer may be made of a single layer including, e.g., tungsten (W), molybdenum (Mo), tungsten silicide ($WSi_2$), molybdenum silicide ($MoSi_2$), chromium (Cr), aluminum (Al), and/or alloys thereof, or may be made of a multi-layer in which an aluminum alloy is formed on a layer including, e.g., tungsten (W), chromium (Cr), and/or a molybdenum (Mo) alloy.

Next, an impurity of a P type or N type may be doped using the gate electrode 245 and the capacitor upper electrode 244 as a mask to form a source/drain region 231 that is doped with the impurity and a channel region 235 that is not doped with the impurity in the semiconductor layer 232.

Here, the P-type impurity may include, e.g., boron (B), aluminum (Al), gallium (Ga), and/or indium (In). These may be used singularly or as a mixture. The N-type impurity may include, e.g., phosphorus (P), arsenic (As), antimony (Sb), and/or bismuth (Bi). These may be used singularly or as a mixture.

In the manufacturing method of the display device including the thin film transistor according to the present embodiment, the source/drain region 231 of the semiconductor layer 232 may be doped with the impurity by using the gate electrode 245 and the capacitor upper electrode 244 as a mask. However, in an implementation, before forming the gate electrode 245 and the capacitor upper electrode 244, a photoresist layer (not illustrated) may be formed on the channel region 235 and the capacitor lower electrode 234 of the semiconductor layer 232, and then the source/drain region 231 of the semiconductor layer 232 may be formed.

Also, in the manufacturing method of the display device according to the present embodiment, the polysilicon as the capacitor lower electrode 234 may not be doped with an impurity, thereby forming a metal oxide silicon (MOS) type capacitor. However, in an implementation, the capacitor lower electrode 234 may be doped with the impurity, thereby forming a metal insulator metal (MIM) type capacitor.

Here, when the source/drain region 231 of the semiconductor layer 232 is formed by using the photoresist layer, i.e., before forming the gate electrode 245 and capacitor upper electrode 244, the photoresist layer may not be positioned on the capacitor lower electrode 234 such that the source/drain region 231 of the semiconductor layer 232 and the capacitor lower electrode 234 may be simultaneously doped with the impurity.

Next, as illustrated in FIG. 5E, an interlayer insulating layer 250 may be formed on the substrate 110 including the gate electrode 245 and capacitor upper electrode 244. The interlayer insulating layer 250 and the gate insulating layer 240 may be etched to form contact holes 251 exposing a portion of the source/drain region 231 of the semiconductor layer 232.

Figure 5F:
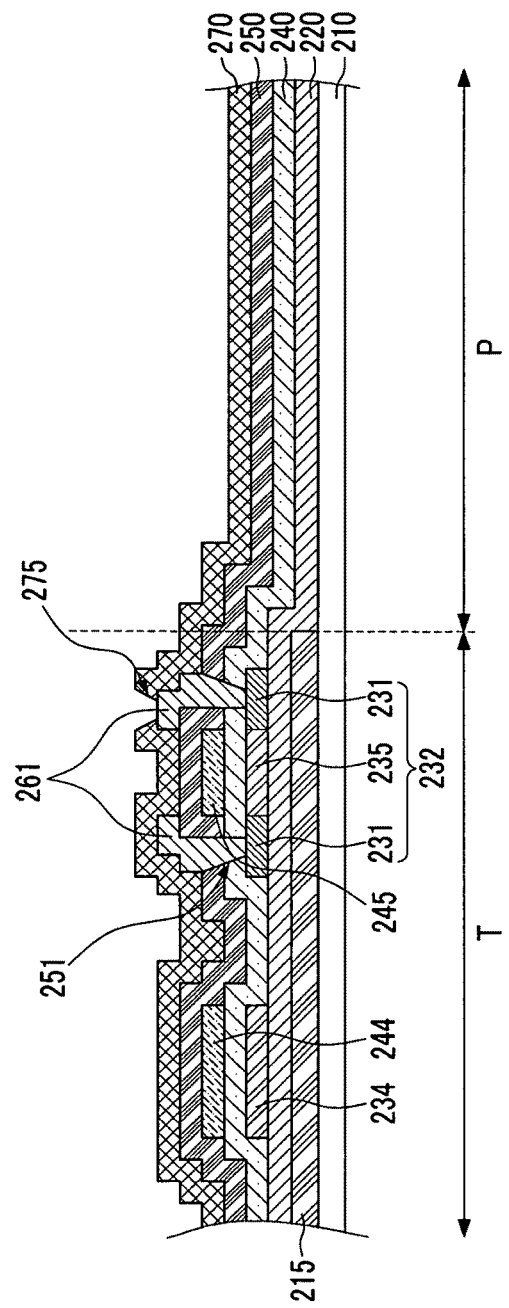

Next, as illustrated in FIG. 5F, a second conductive material layer (not illustrated) may be formed on the interlayer insulating layer 250. Then, the second conductive material layer may be etched to form a source/drain electrode 261 connected to the source/drain region 231 through the contact hole 251, thereby completing the thin film transistor according to the present embodiment. Here, the second conductive material may include, e.g., moly-tungsten (MoW), aluminum (Al), and/or an aluminum alloy such as aluminum-neodymium (Al—Nd). These may be used singularly or as a mixture thereof.

Next, a protective layer 270 may be formed on the source/drain electrode 261. The protective layer 270 may be patterned to form a via hole 275 exposing a portion of one source/drain electrode 261. Here, the protective layer 270 may be made of an inorganic insulating layer including, e.g., silicon oxide ($SiO_2$), silicon nitride ($SiN_x$), or a deposition structure thereof.

In the manufacturing method of the display device including the thin film transistor according to the present embodiment, the protective layer 270 may only be formed on the substrate 210 including the source/drain electrode 261. However, in an implementation, a planarization layer (not illustrated) may be formed and may include, e.g., a benzocyclobutene (BCB), a polyimide (PI), a polyamide (PA), an acryl resin, and/or a phenol resin on the protective layer 270, and the protective layer 270 and the planarization layer may be etched to form the via hole 275 exposing a portion of one source/drain electrode 261. Here, the benzocyclobutene (BCB), polyimide (PI), polyamide (PA), acryl resin, and/or phenol resin may be used singularly or as a mixture thereof.

Figure 5G:
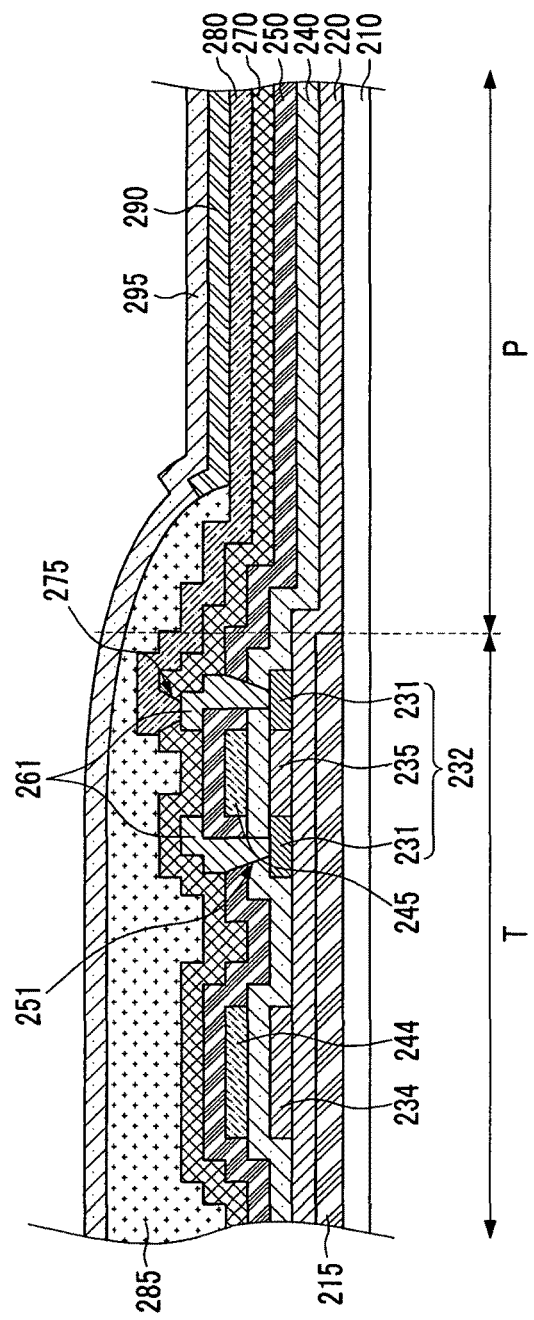

Next, as illustrated in FIG. 5G, a third conductive material layer (not illustrated) may be formed on the protective layer 270. Then, the third conductive material layer may be etched to form a lower electrode 280 connected to the one source/drain electrode 261 through the via hole 275.

Here, the third conductive material layer may be a transparent conductive layer, e.g., ITO and IZO, and/or a reflective layer (not illustrated) including, e.g., aluminum, an aluminum alloy, silver, and/or a silver alloy. The transparent conductive layer may be formed on the reflective layer, thereby forming the lower electrode having a dual structure including the reflective layer and the transparent conductive layer. Here, the aluminum, aluminum alloy, silver, and silver alloy may be used as singularly or as a mixture thereof.

Next, a pixel definition layer 285 exposing a portion of the lower electrode 280 may be formed on the planarization layer 270. An organic layer 290 including one or a plurality of emission layers (not illustrated) may be formed on the lower electrode 280 exposed through the pixel definition layer 285. An upper electrode 295 may be formed on the organic layer 290, thereby completing the display device including the thin film transistor according to the present embodiment.

Here, the pixel definition layer 285 may include, e.g., a polyimide, a benzocyclobutene series resin, a phenol resin, and/or an acrylate. These may be used singularly or as a mixture.

In the manufacturing method of the display device according to the present embodiment, the polysilicon layer 230 may be etched on the substrate 210 to form the capacitor lower electrode 234 and the first conductive material layer may be etched to form the capacitor upper electrode 244. However, in an implementation, the first conductive material layer may be etched to form the capacitor lower electrode 234 and the second conductive material layer may be etched to form the capacitor upper electrode 244.

As a result, in the display device including the thin film transistor according to the present embodiment, when manufacturing the display device in which the light blocking member is under the thin film transistor, the amorphous silicon layer on the light blocking member may be converted into the polysilicon layer by using the directional lateral solidification and the polysilicon layer may be etched to form the semiconductor layer of the thin film transistor, such that the semiconductor layer does not include the uncompleted crystallization growing region.

According to an embodiment, driving characteristics and reliability of a thin film transistor may be improved and thus reliability of a resultant display device including the thin film transistor may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims

What is claimed is:
1. A method for manufacturing a thin film transistor including a semiconductor layer made of polysilicon, the method comprising:
    forming a metal pattern on a substrate;
    forming a first insulating layer on the metal pattern;
    forming an amorphous silicon layer on the first insulating layer;

crystallizing the amorphous silicon layer into a polysilicon layer by using a directional lateral solidification process; and patterning the polysilicon layer to form the semiconductor layer, wherein the directional lateral solidification process includes a repetitive crystallization process including:

performing a first irradiation to one predetermined region of the amorphous silicon layer with a line-shaped laser beam having a predetermined length, width and energy density to completely melt amorphous silicon in the one predetermined region, thereby providing melted silicon in the one predetermined region, allowing the melted silicon in the one predetermined region of the amorphous silicon layer to cool and crystallize into polysilicon, moving the laser beam by less than half of the width of the laser beam in a first direction to another predetermined region, such that the other predetermined region includes a portion of the polysilicon crystallized in the one predetermined region, and performing a secondary irradiation to the other predetermined region to completely melt the polysilicon and amorphous silicon in the other predetermined region, thereby providing melted silicon in the other predetermined region.

2. The method as claimed in claim 1, wherein the line-shaped laser beam is a pulse-type laser beam and has a length of about 365 nm to about 1100 nm, a width of about 5 to about 20 μm, and an energy density of about 150 to about 1000 mJ/cm$^2$.

3. The method as claimed in claim 2, wherein:
the polysilicon layer includes a grain boundary parallel to the first direction, and
the polysilicon layer is crystallized to have a surface roughness defined by a distance between a lowest peak and a highest peak in a surface thereof of less than about 15 nm.

4. The method as claimed in claim 3, wherein the grain boundary is parallel to a current flow direction.

5. The method as claimed in claim 1, wherein:
the metal pattern is a gate electrode corresponding to a portion of the semiconductor layer, and
the first insulating layer is a gate insulating layer.

6. The method as claimed in claim 5, further comprising:
forming an interlayer insulating layer on the semiconductor layer; and
forming a source/drain electrode on the interlayer insulating layer such that the source/drain electrode is electrically connected to one side of the semiconductor layer.

7. The method as claimed in claim 1, wherein the metal pattern is a light blocking member including one or a plurality of opaque layers.

8. The method as claimed in claim 7, wherein the opaque layer includes carbon or at least one of Fe, Co, V, Ti, Al, Ag, Si, Ge, Y, Zn, Zr, W, Ta, Cu, and Pt.

9. The method as claimed in claim 7, further comprising:
forming a gate insulating layer on the semiconductor layer;
forming a gate electrode on the gate insulating layer such that the gate electrode overlaps a portion of the semiconductor layer;
forming an interlayer insulating layer on the gate electrode; and
forming a source/drain electrode on the interlayer insulating layer such that the source/drain electrode is electrically connected to one side of the semiconductor layer.

10. The method as claimed in claim 7, wherein the metal pattern further includes one or a plurality of transparent layers positioned at a side of or between the one or the plurality of opaque layers.

11. The method as claimed in claim 10, wherein the transparent layer includes:
at least one of $SiO_x$ (x=1), $SiN_x$ (x=1), $MgF_2$, $CaF_2$, $Al_2O_3$, and $SnO_2$, or at least one of ITO, IZO, ZnO, and $In_2O_3$.

* * * * *